United States Patent
Shiao et al.

(10) Patent No.: US 7,495,916 B2
(45) Date of Patent: Feb. 24, 2009

(54) LOW COST COLD PLATE WITH FILM ADHESIVE

(75) Inventors: Sam Shiao, Cerritos, CA (US); Steven M. Shimotani, Rancho Palos Verdes, CA (US)

(73) Assignee: Honeywell International Inc., Morristown, NJ (US)

(*) Notice: Subject to any disclaimer, the term of this patent is extended or adjusted under 35 U.S.C. 154(b) by 35 days.

(21) Appl. No.: 11/765,368

(22) Filed: Jun. 19, 2007

(65) Prior Publication Data
US 2008/0316708 A1    Dec. 25, 2008

(51) Int. Cl.
*H05K 7/20* (2006.01)
*H01L 23/36* (2006.01)

(52) U.S. Cl. ............... 361/702; 361/699; 361/700; 361/709; 361/710; 165/80.3; 165/80.4; 257/714

(58) Field of Classification Search ......... 361/698–702, 361/709, 710; 165/80.2, 80.3, 80.4, 104.33, 165/104.22, 104.27, 104.28, 104.32, 185; 257/714–716; 62/259.2; 174/15.1, 16.3, 174/17 R, 17.06, 17.08; 29/840
See application file for complete search history.

(56) References Cited

U.S. PATENT DOCUMENTS

| | | | |
|---|---|---|---|
| 4,188,996 A * | 2/1980 | Pellant et al. ............ | 165/80.4 |
| 4,706,164 A | 11/1987 | L'Henaff et al. | |
| 4,894,709 A | 1/1990 | Phillips et al. | |
| 5,159,529 A * | 10/1992 | Lovgren et al. ............ | 361/699 |
| 5,381,859 A | 1/1995 | Minakami et al. | |
| 5,526,231 A * | 6/1996 | Arz et al. ............ | 361/707 |
| 5,912,802 A | 6/1999 | Nelson | |
| 6,009,938 A | 1/2000 | Smith et al. | |
| 6,050,332 A | 4/2000 | Smith et al. | |
| 6,273,186 B1 | 8/2001 | Ognibene | |
| 6,520,248 B2 | 2/2003 | Gailus et al. | |
| 6,634,421 B2 | 10/2003 | Ognibene | |
| 6,661,658 B2 * | 12/2003 | Capriz et al. ............ | 361/690 |
| 6,679,315 B2 * | 1/2004 | Cosley et al. ............ | 165/80.4 |
| 6,894,900 B2 | 5/2005 | Malone | |
| 6,935,411 B2 * | 8/2005 | Valenzuela ............ | 165/80.4 |
| 6,963,131 B2 | 11/2005 | Frisch et al. | |
| 7,046,515 B1 | 5/2006 | Wyatt et al. | |
| 7,173,823 B1 * | 2/2007 | Rinehart et al. ............ | 361/699 |
| 7,178,586 B2 | 2/2007 | Goldman et al. | |

(Continued)

FOREIGN PATENT DOCUMENTS

DE    33 29 325 A1    3/1984

(Continued)

OTHER PUBLICATIONS

EPO search report dated Oct. 14, 2008.

*Primary Examiner*—Michael V Datskovskiy
(74) *Attorney, Agent, or Firm*—Oral Caglar, Esq.

(57) ABSTRACT

An electronic assembly is constructed with an enclosed fluid-cooled cold plate. Pressurized cooling fluid is propelled through the cold plate to carry away heat from the electronic assembly. The cold plate is constructed from a plurality of enclosure elements which are attached together with a thermally-conductive adhesive. The adhesive may be cured at a low temperature of about 125° C. The cold plate may be produced from thin metal without distortion or warping that might otherwise result from assembly at higher temperatures.

16 Claims, 5 Drawing Sheets

U.S. PATENT DOCUMENTS

| | | | |
|---|---|---|---|
| 7,197,819 B1 * | 4/2007 | Rinehart et al. | 29/840 |
| 7,278,466 B2 * | 10/2007 | Fujisaki | 165/80.4 |
| 7,302,998 B2 * | 12/2007 | Valenzuela | 165/80.4 |
| 7,316,263 B2 * | 1/2008 | Lofland et al. | 165/80.4 |
| 2006/0096738 A1 * | 5/2006 | Kang et al. | 165/80.4 |

FOREIGN PATENT DOCUMENTS

JP    11297907 A  * 10/1999

* cited by examiner

LOW COST COLD PLATE WITH FILM ADHESIVE

BACKGROUND OF THE INVENTION

The present invention is in the field of electronic equipment and, more particularly, electronic equipment which generates heat during its operation.

Certain types of electronic equipment may embody components which generate heat during their operation. Very often these heat-generating components may perform power supplying functions. It is common practice to integrate power-supplying functions along with logic functions in many types of electronic equipment. Such integration may permit electronic functions to be performed in compact and light weight assemblies. Compactness and light weight may be particularly useful in electronic equipment used in aircraft or space vehicles.

Electronic assemblies with integrated power-supplying components may be constructed with integrated heat-absorbing elements. Such heat-absorbing element may be referred to as cold plates. A typical cold plate, used for example in an aircraft, may comprise a metallic plate onto which heat-generating electronic devices are attached. The cold plate may be cooled by a flow of cooling fluid which may be a gas or a liquid. As the fluid flows, excess heat produced by the electronic assembly is carried away.

In some instances, it may be desirable to constrain the cooling fluid as it flows. In these cases, the cold plate may comprise an enclosure. The enclosure may have an entrance port and an exit port for cooling fluid. To enhance cooling, the fluid may be admitted to the cold plate at a high pressure, in the order of about 100 psi to about 300 psi. To withstand these high fluid pressures, the cold plate enclosure must be constructed with substantial mechanical strength. One obvious method for achieving mechanical strength is through use of a thick-walled enclosure. But thick-walled enclosures are inherently heavy and are therefore undesirable for aircraft applications.

To address the issue of desired mechanical strength and low weight, prior-art designers of aircraft cold plates have employed a composite configuration. In this prior-art configuration a metallic fin structure is sandwiched between two relatively thick (about 0.25 inch) metallic plates. The plates and fins are brazed together at a temperature of about 1400° F. to form a cold plate assembly. After brazing the cold-plate assembly may be heat treated at a temperature of about 1100 F. During exposure to these high temperatures the cold-plate assembly may become distorted or warped. It may lose some of its "flatness". Flatness of a cold plate is important because effective heat transfer from electronic devices into the cold plate requires maximum contact between a surface of the electronic device and the cold plate. If the cold plate is not flat the required contact may be diminished.

Restoration of flatness in prior art cold plates, may be achieved by machining an outer surface of the metallic plates and making them thinner. Typically the plate may be machined to reduce its thickness for about 0.25 inch to about 0.1 inch. This machining step may re-introduce flatness but it is costly and difficult to perform.

In some cold plate assemblies, mechanical strength may be enhanced by using bolts to hold the metallic plates and the fin together. Use of bolts, of course, requires creation of holes through which the bolts may pass. Each of these holes presents an opportunity for leakage of the cooling fluid. Consequently bolted cold plate assemblies require elaborate sealing structures around the bolts in order to prevent the cooling fluid leakage around the bolts.

When prior-art enclosed cold plates were used for cooling electronic assemblies, electronic devices were typically placed on only one side of a cold plate. It is very difficult and cumbersome to produce and use vias through an enclosed cold plate. In brazed constructions via apertures are subject to blockage during brazing. In bolted assemblies each via required a dedicated seal. Consequently, electronic assemblies constructed on enclosed cold plates consumed undesirable large areas because electronic devices could not be placed on both sides of an enclosed cold plate and interconnected through the cold plate.

As can be seen, it would be desirable to provide cooled electronic assemblies with economical and lightweight enclosed cold plates Additionally, it would be desirable to provide cooled electronic assemblies with electrically interconnected electronic devices placed on both sides of an enclosed cold plate.

SUMMARY OF THE INVENTION

In one aspect of the present invention, an electronic assembly comprises a heat-producing electronic device and a cold-plate enclosure. The heat-producing device is in contact with a planar surface of the cold-plate enclosure. The cold-plate enclosure comprises a plurality of enclosure elements which are adhesively attached together whereby the cold-plate enclosure is adapted to constrain a flow of cooling fluid.

In another aspect of the present invention, a cold plate comprises a plurality of thermally-conductive enclosure elements. At least one of the enclosure elements has a planar surface. The enclosure elements are connected to each other with a thermally-conductive adhesive to form a fluid flow-constraining enclosure through which cooling fluid may pass.

In still another aspect of the present invention, a method for cooling an electronic device comprises the steps of providing an enclosure by positioning a thermally conductive adhesive film between at least two enclosure elements and curing the film, attaching the electronic device to the enclosure to transfer heat from the device to the enclosure, and propelling cooling fluid through the enclosure to transfer heat from the enclosure.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention may be useful in electronic systems which generate excess heat. More particularly, the present invention may provide an economical and lightweight cooling system for an electronic system. The present invention may be particularly useful in vehicles such as aircraft in which low weight of components is a valuable property.

In contrast to prior-art electronic systems, among other things, the present invention may provide an adhesively assembled cooling system for electronic devices. The present invention may, instead of utilizing a brazed or bolted cold plate, may utilize a pressurized cold plate that is assembled with adhesives. The present invention may also incorporate a method of constructing a cold plate at temperatures low enough to preclude thermally-induced warping of the cold plate.

Figure 1:
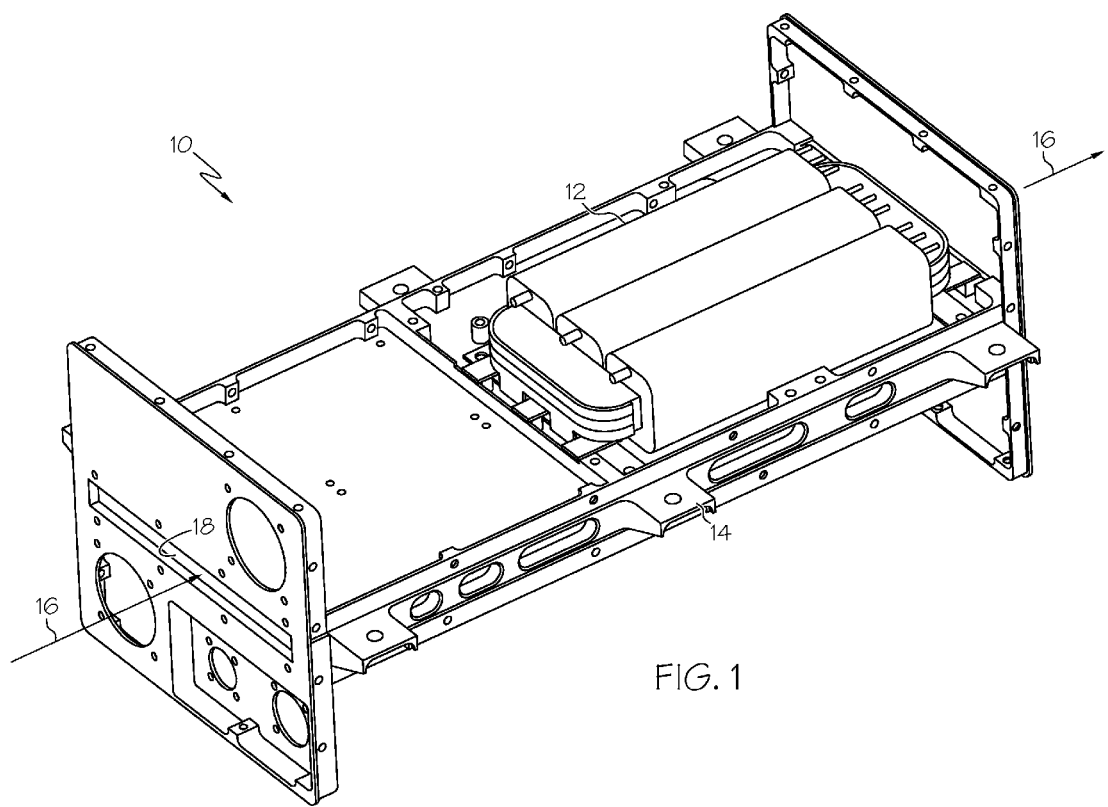
FIG. 1 is partial perspective view of an electronic assembly constructed in accordance with the invention.

Referring now to FIG. 1, an electronic assembly 10 may comprise an electronic device 12 attached to a cold plate 14. The electronic device 12 may produce heat during its operation. Unless removed, the heat produced by the electronic device 12 may cause a temperature rise that may produce malfunctioning of the electronic device 12. In the electronic assembly 10, heat generated by the electronic device 12 may transfer into the cold plate 14. Cooling fluid 16 such as cooled gas or liquid may pass through the cold plate 14. The cooling fluid 16 may absorb heat from the cold plate 16 and carry the heat away from the electronic assembly 10. The cooling fluid 16 may enter the cold plate 14 through an entry port 18 and exit from the cold plate 14 through an exit port 20 (not shown on FIG. 1). Effectiveness of cooling by the fluid 16 is enhanced when the fluid is passed through the cold plate 14 at an elevated pressure. In a typical cold plates 14 used in an aircraft, the cooling fluid 16 may be introduced at a pressure of about 100 psi to about 300 psi.

Figure 2:
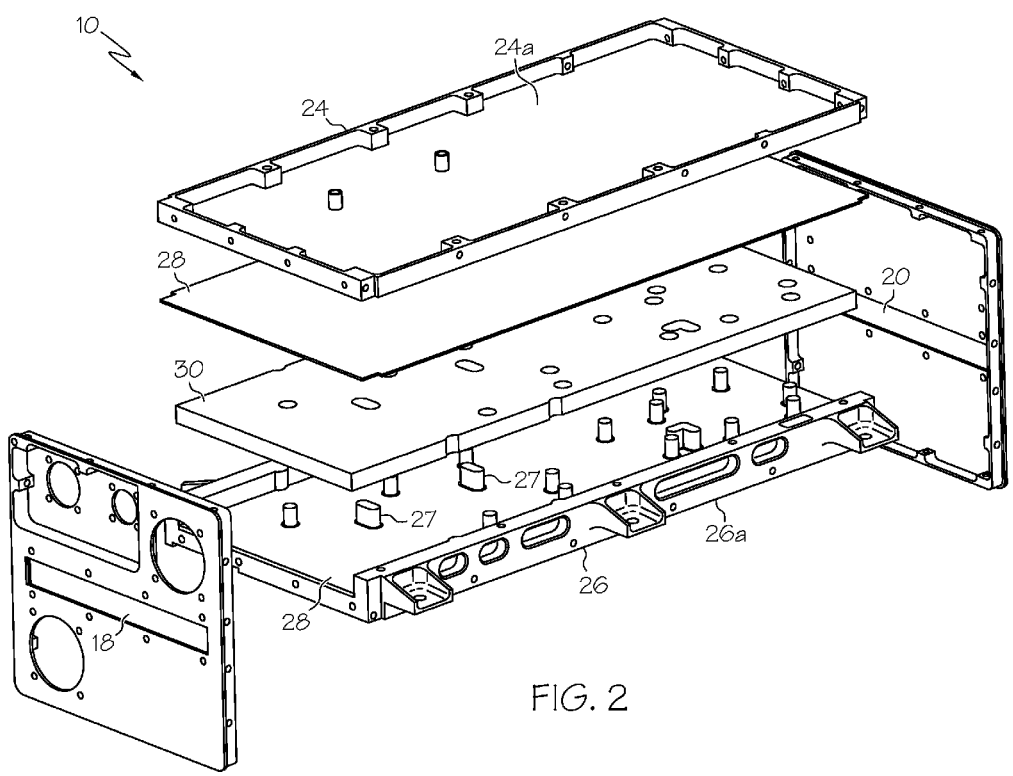
FIG. 2 is a partial exploded view of a cold plate in accordance with the invention.

Referring now to FIG. 2, there is shown an exploded perspective illustration of portions of the cold plate 14 of FIG. 1. The portions may comprise enclosure elements 24 and 26 and a thermally-conductive adhesive film 28. The adhesive film 28 may be a simple flat sheet. The enclosure element 24 may be formed with integral interconnection pillars 27. Each of the enclosure elements 24 and 26 may comprise planar surfaces 24a and 26a respectively. The adhesive film 28 may be positioned between the enclosure elements 24 and 26. It may be seen that after assembly, the adhesive film 28 may be sandwiched between the enclosure elements 24 and 26 and the pillars 27. The adhesively joined enclosure elements 24 and 26 may thus form a cold-plate enclosure, i.e. the cold plate 14. In other words, the cold plate 14 may comprise an enclosed channel 29 (see FIG. 3) through which the cooling fluid 16 may flow.

Various materials may be employed as the adhesive film 28. One material suitable for the adhesive film 28 is glass-supported epoxy with suspended metallic particles. One example of such a material is marketed under the tradename Ablefilm® 550 and may be obtained from Ablestik Co. in Rancho Dominguez, Calif. When this material is used to assemble the cold plate 14, an adhesive bond may be produced with a tensile modulus between about 4 and about 10 Kpsi. Typically, an effective adhesive bond may be achieved by curing the cold plate 14 at a temperature between about 125° C. and 150° C. for a time period between about 30 minutes and 2 hours.

It may be noted that cure temperatures of about 125° to about 150° C. are substantially lower than brazing temperatures of about 1400° C. used in the assembly of prior art cold plates. Because such a relatively low curing temperature may be employed, planar surfaces 24a and 26a may not warp during curing even if the enclosure elements 24 and 26 are formed of very thin material. For example, the enclosure elements 24 and 26 may be comprised of aluminum with a thickness of between about 0.06 inch and 0.10 inch. After curing the planar surfaces 24a and 26a may remain flat to within 0.002 inch. In other words, no portion of one of the planar surfaces 24a or 26a may deviate more than 0.002 inch from a median plane of that surface. Such desirable flatness may allow for a uniform thermal contact between the electronic devices 12 and the cold plate 14. Consequently, effective heat transfer between the electronic devices 12 and the cold plate 14 may result.

Figure 3:
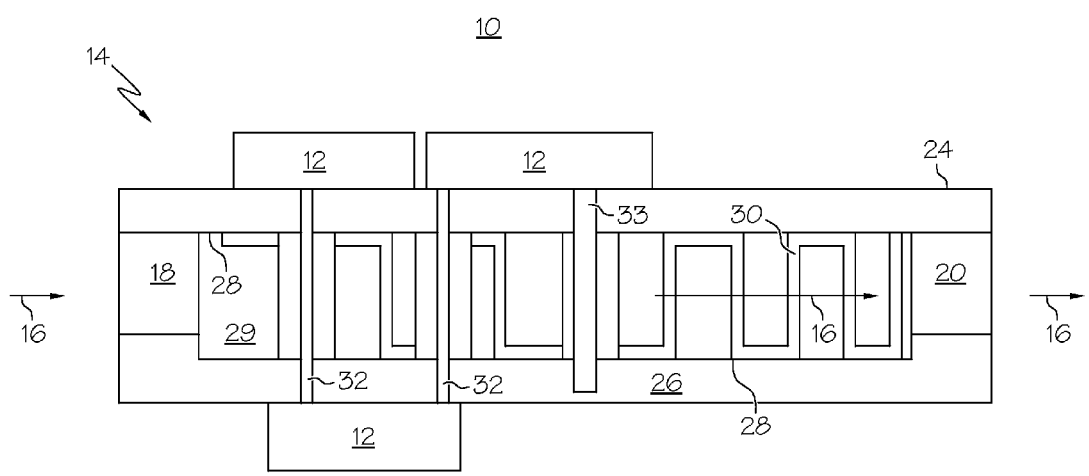
FIG. 3 is a partial cross-sectional elevation view of an electronic assembly in accordance with the invention.

Referring now to FIG. 3, a cross-sectional view of one exemplary embodiment of the electronic assembly 10 shows that a cooling fin 30 may be sandwiched between the enclosure elements 24 and 26. The cooling fin 30 may be in thermal contact with the one and/or both of the enclosure elements 24 and/or 26. Heat from the electronic devices 12 may transfer into the enclosure elements 24 and 26. The cooling fin 30 may be attached to the enclosure element 24 and 26 with thermally-conductive adhesive such as the adhesive film 28. Consequently, heat transferred into the enclosure elements 24 and 26 may transfer into the cooling fin 30 through the thermally-conductive adhesive. Cooling fluid 16 may pass through the cold plate 14 and across the cooling fin 30. Heat from the cooling fin 30 may transfer into the cooling fluid 16. Thus the cooling fluid 16 may carry away excess heat from the electronic device 12.

The exemplary embodiment of the electronic assembly 10 shows one or more of the electronic devices 12 positioned on both of the planar surfaces 24a and 26a. The electronic devices 12 may be electrically interconnected with one another through vias 32 which may pass through the enclosure elements 24 and 26 and also through the pillars 27. Each of the vias 32 may comprise interconnecting apertures in the enclosure elements 24 and 26 one of the pillars 27. The pillars 27 may be formed as integral projections from either and/or both of the enclosure elements 24 or 26. Or alternatively, the pillars 27 may comprise discrete elements which may be attached to the enclosure elements 24 and 26. The vias 32 may be formed after the enclosure elements 24 and 26 are assembled. In this case the vias may be formed by conventional aperture forming techniques, such as drilling. Alternatively, the vias 32 may be partially preformed prior to assembly of the enclosure elements 24 and 26, i.e. the pillars 27 and the enclosure elements may be provided with preformed apertures which are aligned after assembly. In this latter case, portions of the adhesive film 28 may occlude the vias 32 after assembly. But these occluding portions of the adhesive film 28 may be merely punctured in order to complete fully-open vias 32. As discussed above, preformed vias are not a practical option in prior-art brazed cold plates because brazing material blocks the vias and a drilling operation may be required to open the vias.

Figure 4:
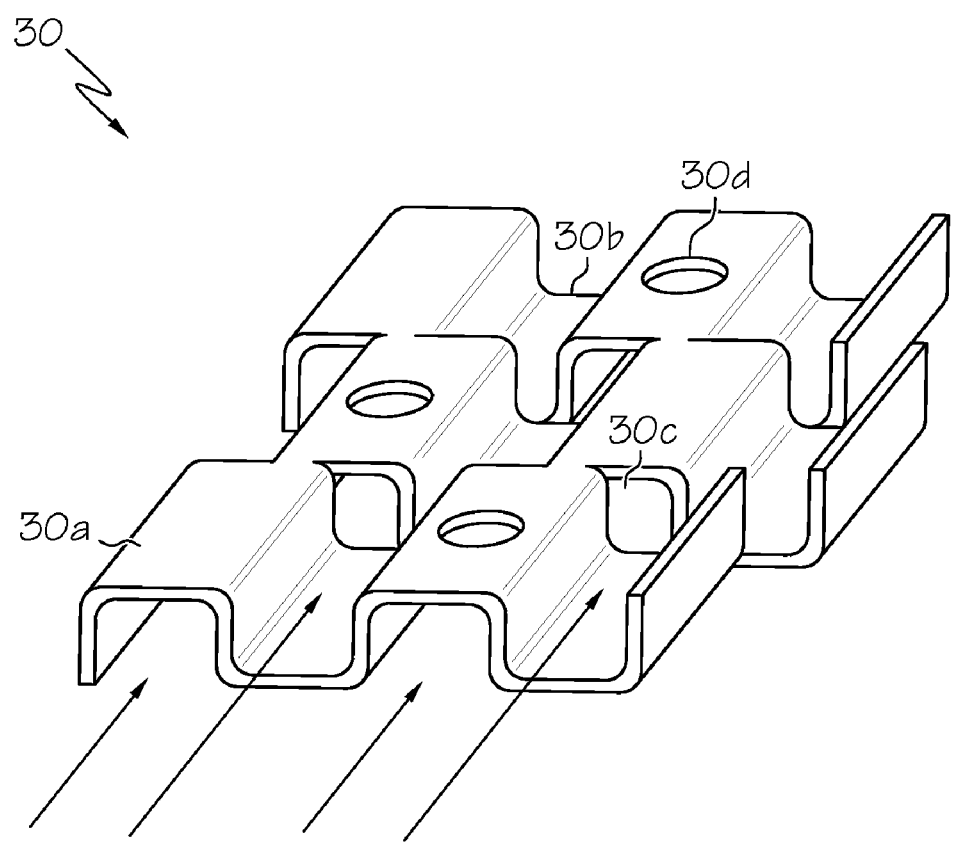
FIG. 4 is a perspective view of a portion of a cooling fin in accordance with the invention.

Referring now to FIG. 4, there is shown a portion of one exemplary embodiment of the cooling fin 30. The cooling fin 30 may comprise ridges 30a, channels 30b, and interconnecting passages 30c formed in a staggered arrangement that may allow the cooling fluid 16 to contact all surfaces of the cooling fin 30 as the fluid 16 passes over and through the cooling fin 30. Additionally, the cooling fin 30 may comprise apertures 30d through which the pillars 27 of FIGS. 2 and 3 may pass. Or segmental cooling fins 30 may be placed between the pillars 27.

It should be understood that the electronic assembly 10 may be constructed with electronic devices 12 on only one of the planar surfaces 24a and/or 26a. In this case, the cold plate 14 may be constructed without the interconnection pillars 27. Also, the electronic assembly may be constructed so that the cold plate 14 does not contain one of the cooling fins 30. Additionally, the pillars 27 may be utilized to enclose bolts or screws 33 which may provide added strength to the cold plate 14.

Figure 5:
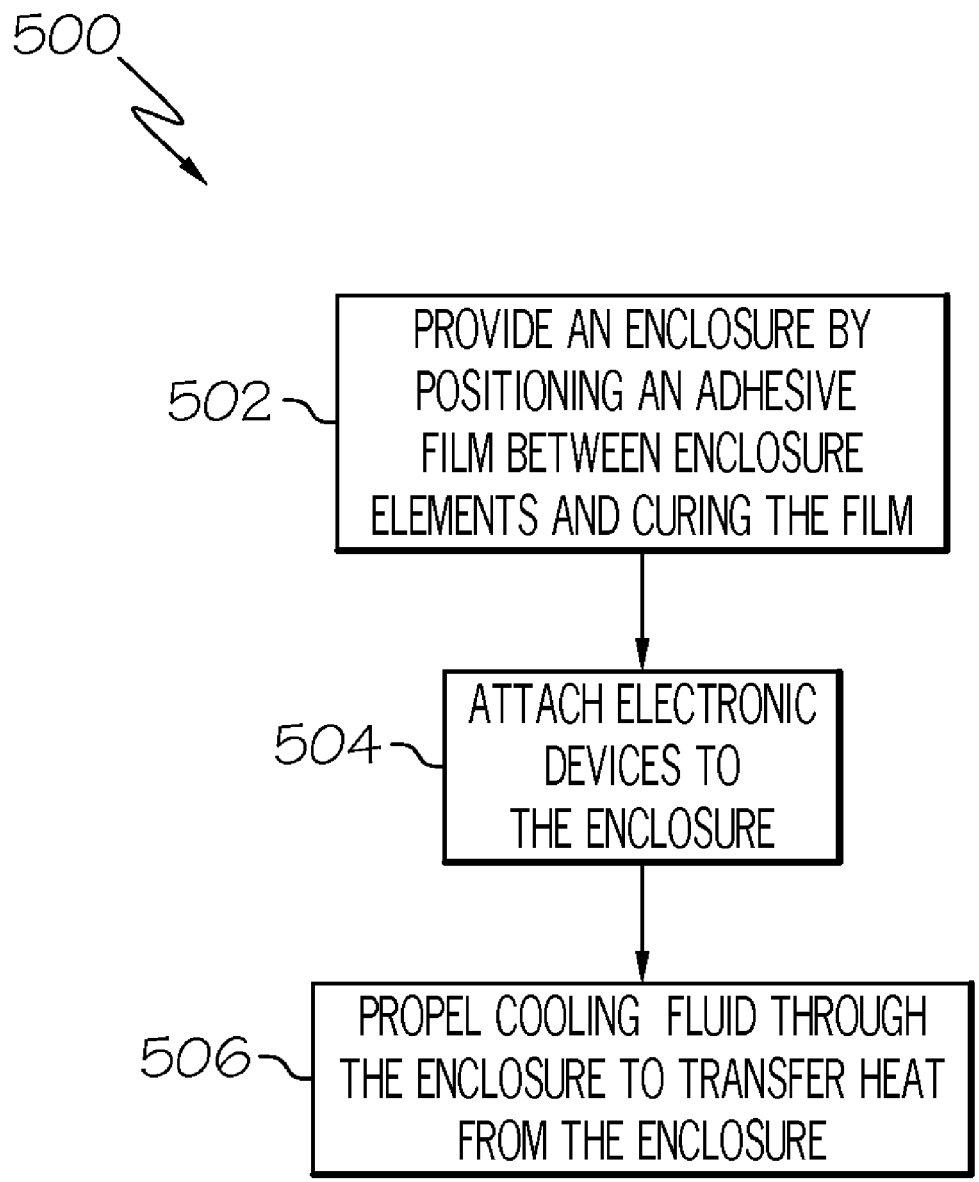
FIG. 5 is a flow chart of a method of cooling an electronic device in accordance with the present invention.

In one embodiment of the present invention, a method is provided for cooling an electronic assembly (e.g. the electronic assembly 10). In that regard the method may be understood by referring to FIG. 5. In FIG. 5, a flow chart portrays various aspects of an inventive method 500. In a step 502, an enclosure (e.g. the cold plate 14) may be provided by positioning a thermally-conductive adhesive film (e.g. the adhesive film 28) between two metallic enclosure elements (e.g. the enclosure elements 24 and 26) and curing the film. In a step 504 electronic devices (e.g. the electronic devices 12) may be placed into thermal contact with the enclosure to transfer heat into the enclosure. In a step 506 cooling fluid (e.g. the fluid 16) may be propelled through the enclosure to transfer heat from the enclosure.

It should be understood, of course, that the foregoing relates to exemplary embodiments of the invention and that modifications may be made without departing from the spirit and scope of the invention as set forth in the following claims.

We claim:

1. An electronic assembly for regulating the temperature of a plurality of heat producing electronic devices comprising:
    a cold-plate enclosure having:
    a planar surface for contact with the heat-producing electronic device; and
    a plurality of enclosure elements which are adhesively attached together to form an enclosed channel for a flow of cooling fluid
    at least one of the electronic devices attached to one of the enclosure elements;
    at least one of the electronic devices attached to another one of the enclosure elements;
    at least one via extending between the planar surfaces of at least two of the enclosure elements; and
    wherein the electronic devices are electrically interconnected through the vias.

2. The electronic assembly of claim 1 wherein the enclosure elements are adhesively attached together with a thermally-conductive adhesive film.

3. The electronic assembly of claim 2 wherein the adhesive film provides a bond strength of at least about 4 Kpsi whereby the cold-plate enclosure is adapted to constrain the cooling fluid pressurized to at least about 100 psi.

4. The electronic assembly of claim 1 wherein the cold plate enclosure comprises:
    at least two of the enclosure elements; and
    a cooling fin sandwiched between the at least two enclosure elements.

5. The electronic assembly of claim 1 wherein the enclosure elements have a thickness of between about 0.060 inch and 0.10 inch.

6. The electronic assembly of claim 1 wherein a planar surface of at least one of the enclosure elements is flat with any point of the surface being no more than 0.002 inch from a median plane of the surface.

7. The electronic assembly of claim 1 wherein:
    at least one via passes through a pillar; and
    the pillar is thermally interconnected with the planar surfaces.

8. The electronic assembly of claim 7 wherein the at least one pillar is formed integrally with at least one of the enclosure elements.

9. A cold plate comprising:
    a plurality of enclosure elements having thermally-conductive planar surfaces;
    the enclosure elements being connected to each other with a thermally-conductive adhesive to form an enclosed channel through which pressurized fluid may pass to extract heat from the planar; and
    at least one via interconnecting at least two planar surfaces of the cold plate whereby an electrical interconnection between electronic devices may be made through the via.

10. The cold plate of claim 9 wherein the enclosure elements have a thickness of between about 0.060 inch and about 0.10 inch.

11. The cold plate of claim 9 further comprising a cooling fin sandwiched between the enclosure elements.

12. A method for cooling an electronic device comprising the steps of:
    providing an enclosure by positioning a thermally conductive adhesive film between at least two enclosure elements and curing the film;
    attaching the electronic device to the enclosure to transfer heat from the device to the enclosure by attaching the electronic devices on at least two of the enclosure elements and electrically interconnecting the electronic devices through the enclosure; and
    propelling cooling fluid through the enclosure to transfer heat from the enclosure.

13. The method of claim 12 wherein the step of propelling cooling fluid is performed at a pressure of at least about 100 psi.

14. The method of claim 12 further comprising the step of adhesively attaching a cooling fin between the at least two metallic enclosure elements.

15. The method of claim 12 wherein the step of curing the film is performed at a temperature no greater than about 150° C.

16. The method of claim 12 wherein the step of curing produces an adhesive bond with a tensile modulus of at least about 4 Kpsi.

* * * * *